(12) United States Patent
Wang et al.

(10) Patent No.: US 12,063,826 B2
(45) Date of Patent: Aug. 13, 2024

(54) DISPLAY DEVICE AND ELECTRONIC APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Yiming Wang, Beijing (CN); Haotian Yang, Beijing (CN); Fuzheng Xie, Beijing (CN); Xiaoxia Liu, Beijing (CN); Kang Wang, Beijing (CN); Junhui Yang, Beijing (CN); Jiaxiang Zhang, Beijing (CN); Zhenhua Zhang, Beijing (CN); Renzhe Xu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 479 days.

(21) Appl. No.: 17/419,776

(22) PCT Filed: Aug. 27, 2020

(86) PCT No.: PCT/CN2020/111781
§ 371 (c)(1),
(2) Date: Jun. 30, 2021

(87) PCT Pub. No.: WO2022/041056
PCT Pub. Date: Mar. 3, 2022

(65) Prior Publication Data
US 2022/0320233 A1 Oct. 6, 2022

(51) Int. Cl.
*G06F 3/041* (2006.01)
*H04M 1/02* (2006.01)
(Continued)

(52) U.S. Cl.
CPC ........... *H10K 59/131* (2023.02); *G06F 3/041* (2013.01); *H04M 1/0266* (2013.01);
(Continued)

(58) Field of Classification Search
CPC ...... H10K 59/40; H10K 59/131; H10K 59/12; H10K 77/111; H10K 77/10;
(Continued)

(56) References Cited

U.S. PATENT DOCUMENTS 10,734,469 B2    8/2020  Song
2018/0120616 A1* 5/2018  Kanou ............... G02F 1/13338
(Continued)

FOREIGN PATENT DOCUMENTS

CN    108881539 A    11/2018
CN    208158644 U    11/2018
(Continued)

OTHER PUBLICATIONS

Written Opinion for International Application No. PCT/CN2020/111781 mailed May 27, 2021.

*Primary Examiner* — Sahlu Okebato
(74) *Attorney, Agent, or Firm* — Perilla Knox & Hildebrandt LLP; Kenneth A. Knox (57) ABSTRACT

A display device includes a flexible display panel including a display part, a bonding part, and a substrate bending part connecting the display part and the bonding part, the bonding part being located on the back side of the display part, and a side of the bonding part away from the display part being the bonding side, the driving chip being arranged on the bonding side of the bonding part, and having a first side and a second side opposite in the first direction, where the first side is close to the substrate bending part, and the second side is distal to the substrate bending part, the first direction being perpendicular to the thickness direction; a
(Continued)

main flexible circuit board, disposed on the second side of the driving chip and connected to the bonding side of the bonding part; a touch layer; and a control flexible circuit board.

20 Claims, 5 Drawing Sheets (51) Int. Cl.
*H10K 50/86* (2023.01)
*H10K 59/131* (2023.01)
*H10K 59/40* (2023.01)
*H10K 77/10* (2023.01)
*H10K 102/00* (2023.01)

(52) U.S. Cl.
CPC ............. *H10K 50/86* (2023.02); *H10K 59/40* (2023.02); *H10K 77/111* (2023.02); *G06F 2203/04102* (2013.01); *H10K 2102/311* (2023.02)

(58) Field of Classification Search
CPC ............. H10K 2102/311; H10K 50/87; H10K 2102/351; H05K 2201/05; H05K 3/361; H04M 1/026–0269
See application file for complete search history.

(56) References Cited

U.S. PATENT DOCUMENTS

| | | |
|---|---|---|
| 2020/0020754 A1 | 1/2020 | Kim et al. |
| 2020/0020759 A1 | 8/2020 | Song |
| 2020/0402447 A1* | 12/2020 | An ..................... H01L 27/0248 |
| 2021/0019001 A1 | 1/2021 | Ji et al. |
| 2021/0064162 A1* | 3/2021 | Yin ..................... G06F 3/04164 |
| 2022/0252920 A1* | 8/2022 | Xi ....................... G02F 1/13452 |

FOREIGN PATENT DOCUMENTS

| | | |
|---|---|---|
| CN | 109542270 A | 3/2019 |
| CN | 110096176 A | 8/2019 |
| CN | 111580699 A | 8/2020 |
| CN | 211604563 U | 9/2020 |
| IN | 1111312070 A | 6/2020 |
| WO | 2019174041 A1 | 9/2019 |

* cited by examiner

DISPLAY DEVICE AND ELECTRONIC APPARATUS

CROSS-REFERENCE TO RELATED APPLICATION

The present application is a national phase application under 35 U.S.C. § 371 of International Patent Application No. PCT/CN2020/111781 filed on Aug. 27, 2020, where the contents of which are hereby incorporated by reference in its entirety herein.

TECHNICAL FIELD

The present disclosure relates to display technologies, in particular to a display device and an electronic apparatus.

BACKGROUND

Full-screen mobile phones that have become popular in current mobile phone industry have a narrower top area, bottom area, and border area. The main advantage of the full screen is an ultra-high screen-to-body ratio, which not only brings a better visual experience, but also makes an appearance of the full screen simpler and more beautiful. However, the full screen also brings many problems to an entire mobile phone. For example, a design of a front camera, fingerprint recognition, earpiece, distance sensor, and even the antenna needs to be adjusted. Among them, the antenna is an important part of the mobile phone for receiving and sending signals, and thus is more affected compared with the others.

SUMMARY

Embodiments of the present disclosure provide a display device and an electronic apparatus.

A first aspect of the present disclosure provides a display device, including: a flexible display panel having a display part, a bonding part and a substrate bending part connecting the display part and the bonding part, where the display part comprises a display side and a back side opposite in a thickness direction of the display part, the bonding part is disposed on the back side of the display part, and a bonding side of the bonding part is away from the display part; a driving chip disposed on the bonding side of the bonding part, where the driving chip comprises a first side and a second side opposite to each other in a first direction, the first side is close to the substrate bending part, and the second side is distal to the substrate bending part, wherein the first direction is perpendicular to the thickness direction; a main flexible circuit board, disposed on the second side of the driving chip and connected to the bonding side of the bonding part; a touch layer disposed on the display side of the display part; and a touch flexible circuit board, wherein an end of the touch flexible circuit board is connected to the touch layer, and the other end of the touch flexible circuit board is connected to the main flexible circuit board. The orthographic projection of the touch flexible circuit board on the bonding part and orthographic projection of the driving chip on the bonding part overlap.

In an exemplary embodiment of the present disclosure, the display device further includes: a spacer disposed on the bonding side of the bonding part, and the spacer is located on one side or both sides of the driving chip in the first direction. A thickness of the spacer is greater than a thickness of the driving chip.

In an exemplary embodiment of the present disclosure, a difference between the thickness of the spacer and the thickness of the driving chip is greater than or equal to 50 µm.

In an exemplary embodiment of the present disclosure, a gap between the spacer and the driving chip is greater than or equal to 0.3 mm.

In an exemplary embodiment of the present disclosure, orthographic projection of the driving chip on a reference plane is located within orthographic projection of the spacer on the reference plane. The reference plane is a plane parallel to the thickness direction.

In an exemplary embodiment of the present disclosure, a size of the spacer in a second direction is equal to a size of the driving chip in the second direction, and the second direction is perpendicular to the first direction and the thickness direction.

In an exemplary embodiment of the present disclosure, the spacer is bonded to the bonding part, and the spacer is bonded to the touch flexible circuit board.

In an exemplary embodiment of the present disclosure, the touch flexible circuit board includes a first portion, a second portion, and a bending portion connecting the first portion and the second portion. The first portion is located on a side of the touch layer away from the display part and connected to the touch layer; the second portion is located on the side of the bonding part away from the display part, and an end of the second portion distal to the bending portion is connected to the main flexible circuit board. The orthographic projection of the driving chip on the bonding part is located in the orthographic projection of the second portion on the bonding part.

In an exemplary embodiment of the present disclosure, a size of the second portion in a second direction is equal to a size of the driving chip in the second direction, and the second direction is perpendicular to the first direction.

In an exemplary embodiment of the present disclosure, a size of the first portion n the second direction is less than a size of the touch layer in the second direction, and the orthographic projection of the first portion on the touch layer is located within the touch layer; a size of the bending portion in the second direction is equal to the size of the first portion in the second direction, and two side surfaces of the bending portion in the second direction are in flush with two side surfaces of the first portion in the second direction respectively; the size of the second portion in the second direction is greater than a size of the bending portion in the second direction, and two side surfaces of the second portion in the second direction are located outside of two side surfaces of the bending portion in the second direction respectively, an end of the second portion distal to the bending portion is provided with a plug-in part, and the side of the main flexible circuit board away from the display part is provided with a connector that is plugged into the plug-in part.

In an exemplary embodiment of the present disclosure, a spacing between the second portion and the display part in the second direction is from 15 mm to 30 mm.

In an exemplary embodiment of the present disclosure, the display device further includes a polarizer disposed on the side of the touch layer away from the display part. The orthographic projection of the polarizer on the touch layer has a notch, and the orthographic projection of the first portion on the touch layer is located in the notch.

In an exemplary embodiment of the present disclosure, the thickness of the first portion is less than the thickness of the polarizer. The display device further includes: a flattened portion disposed on a side of the first portion away from the touch layer, a surface of the flattened portion away from the touch layer is flush with the surface of the polarizer away from the touch layer.

In an exemplary embodiment of the present disclosure, the thickness of the substrate bending part is less than the thickness of the display part and the thickness of the bonding part; and the display device further comprises a protective film layer. The protective film layer is configured to cover a surface of the substrate bending part that is close to the bending portion, and cover part of surface of the display part and the bonding pan that is close to the substrate bending part.

In an exemplary embodiment of the present disclosure, the display device further includes a heightening film layer disposed between the bonding part and the display part.

In an exemplary embodiment of the present disclosure, the display device further includes a heat dissipation film layer located on the back side of the display part and disposed on the side of the heightening film layer away from the bonding part.

A second aspect of the present disclosure provides an electronic apparatus including any one of the display device described above.

BRIEF DESCRIPTION OF THE DRAWINGS

The accompanying drawings are used to provide a further understanding of the embodiments of the present disclosure, and constitute a part of the specification. Together with the embodiments of the present disclosure, the drawings are used to explain the present disclosure, and do not constitute a limitation to the present disclosure. By describing detailed embodiments with reference to the accompanying drawings, the above and other features and advantages will become more apparent to those skilled in the art. In the drawings.

DETAILED DESCRIPTION

Exemplary embodiments will now be described more fully with reference to the accompanying drawings. However, the exemplary embodiments can be implemented in various forms, and should not be construed as being limited to the embodiments set forth herein; on the contrary, these embodiments are provided so that the present disclosure will be comprehensive and complete, and the concept of the exemplary embodiments may be fully conveyed to those skilled in the art. The same reference numerals in the drawings indicate the same or similar structures, and thus their detailed descriptions will be omitted. It should be noted that in the drawings, the sizes of layers and regions may be enlarged for clarity of illustration.

Although relative terms such as "upper" and "lower" are used in this specification to describe the relative relationship between one component and another component, these terms are used only for convenience, for example, are used for referring to example directions as shown in the drawings. It can be understood that if the devices are turned upside down, the component described as "upper" will become the "lower" component. When a structure is "on" another structure, it may mean that the structure is integrally formed on the other structure, or that the structure is "directly" installed on the other structure, or that the structure is "indirectly" installed on the other structure through another structure.

The terms "include" and "have" are used to mean open-ended inclusion, and mean that, in addition to the listed elements/components/etc., there may be additional elements/components and so on. The term "connection" can be used to indicate direct connection or indirect connection, and can also be used to indicate electrical connection or mechanical connection.

In the present disclosure, the terms "first" and "second" are only used for descriptive purposes, and cannot be understood as indicating or implying relative importance.

Figure 1:
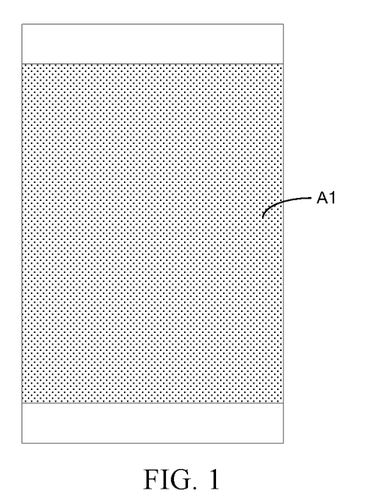
FIG. 1 is a schematic structural diagram of a 5.7-inch full-screen mobile phone.
Figure 2:
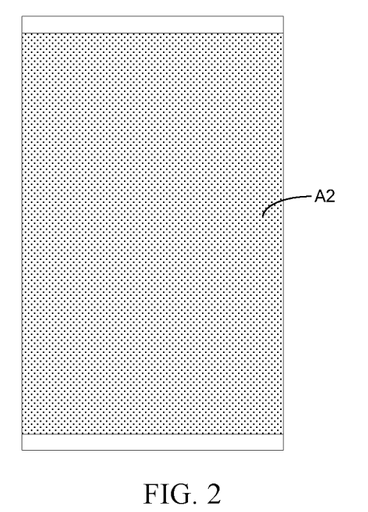
FIG. 2 is a schematic structural diagram of a general 5.2-inch screen mobile phone.

At present, in terms of the overall size, a 5.7-inch full-screen mobile phone shown in FIG. 1 is relatively similar to a general 5.2-inch mobile phone shown in FIG. 2. However, the area of display region A1 of the 5.7-inch full-screen mobile phone is greater than the area of display region A2 of the general 5.2-inch mobile phone. In case that the size of the entire mobile phone remains constant, a space of antennas of the mobile phone will be affected if the screen-to-body ratio is increased.

On the other hand, the number of antennas needs to constantly increase depending on demands of smartphones on MEMO (Multi Input Multi Output), 2CA (Carrier Aggregation), 3CA, 4CA, and 5G (5th generation mobile networks), as well as low-frequency 600M. If all of the above functions are available, the smart phone would only need 2-4 antennas, but it will increase to 4-7 antennas as for a full-screen phone. Therefore, a full-screen mobile phone needs to include multiple antennas in a small space no matter from the perspective of the number of antennas or the antenna space remained.

Therefore, in order to improve the performance of antennas of the mobile phone and increase the number of antennas in a limited space, it is necessary to find ways to increase the design space of the antennas.

Figure 3:
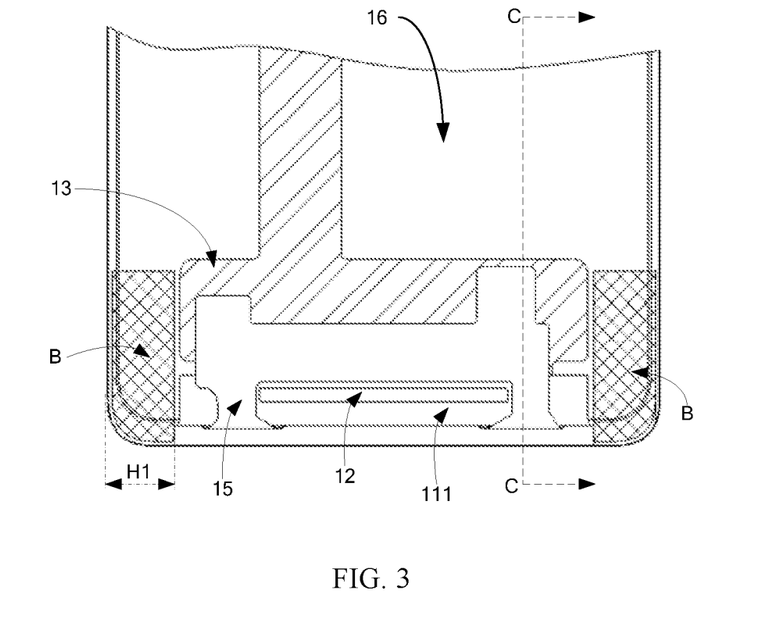
FIG. 3 is a schematic diagram illustrating partial structures of a display device according to an embodiment of the present disclosure.
Figure 4:
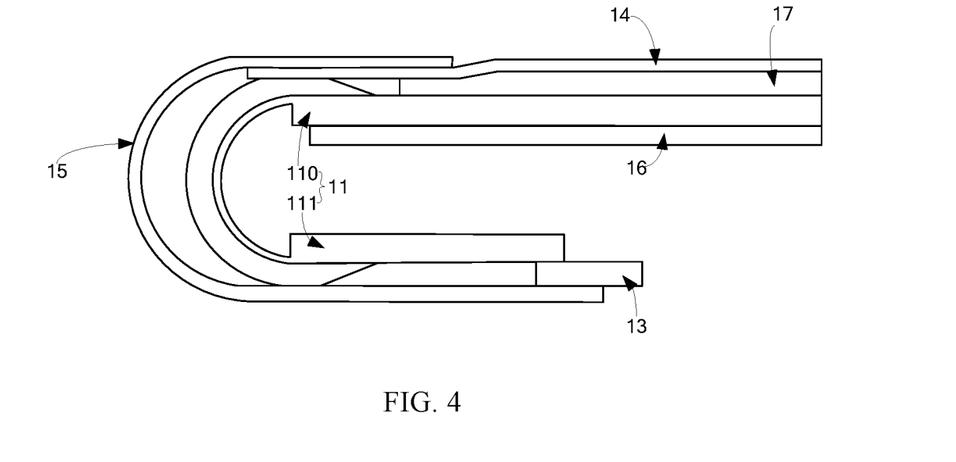
FIG. 4 is a schematic cross-sectional view taken along line C-C shown in FIG. 3.

In view of the above, embodiments of the present disclosure provide a display device 10 that can be applied to an electronic apparatus such as mobile phones. As shown in FIG. 3 and FIG. 4, the display device 10 may include a flexible display panel 11, a driving chip 12, a main flexible circuit board 13, a touch layer 14, and a touch flexible circuit board 15. The flexible display panel 11 includes a display part 110 and a bonding part 111 bent to the back side of the display part 110. The back side of the display part 110 is distal to a display side of the display part 110, in other words, the back side and the display side of the display part 110 are arranged opposite to each other in the thickness direction Z. The driving chip 12 is arranged on a bonding side of the bonding part 111, and the bonding side of the bonding part 111 is the side away from the display part 110. The side of the driving chip 12 away from the bent connection of the bonding part 111 is provided with the main flexible circuit board 13. The main flexible circuit board 13 is connected to the bonding part 111. The touch layer 14 is arranged on the display side of the display part 110. An end of the touch flexible circuit board 15 is connected to the touch layer 14, and the other end is bent to the bonding side of the bonding part 111 and is connected to the main flexible circuit board 13 through traces on both sides of the driving chip 12. It should be noted that the region of the touch flexible circuit board 15 corresponding to the driving chip 12 has a hollow design.

Further, as shown in FIG. 4, the display device 10 may further include a heat dissipation film layer 16 and a first optically clear adhesive (OCA) 17. The heat dissipation film layer 16 is located on the back side of the display part 110. The first optically clear adhesive 17 is located between the display part 110 and the touch layer 14.

In the embodiment of the present disclosure, the driving chip 12, the main flexible circuit board 13, and the touch flexible circuit board 15 are bonded on the back side so that the screen-to-body ratio is increased without changing the size of the entire mobile phone. However, as shown in FIG. 3, the touch flexible circuit board 15 is connected to the main flexible circuit board 13 through traces on both sides of the driving chip 12 so that the width H1 of the clearance zone B on both sides of the driving chip 12 is relatively narrow, and is generally about 8 mm, which does not facilitate the disposition of more antennae or improve poor antenna performance.

Figure 5:
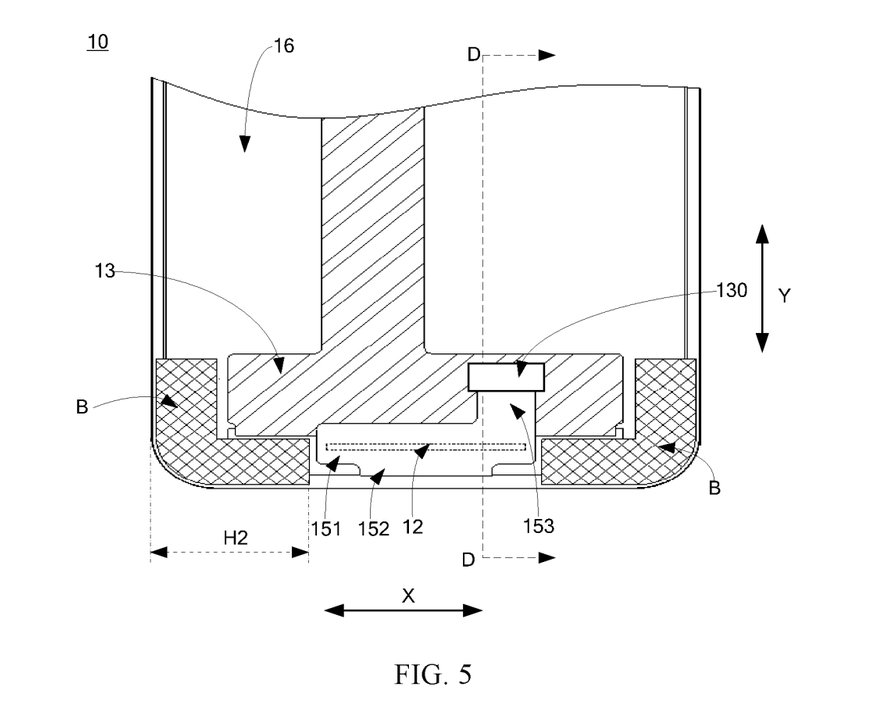
FIG. 5 is a schematic diagram illustrating partial structures of a display device according to another embodiment of the present disclosure.
Figure 6:
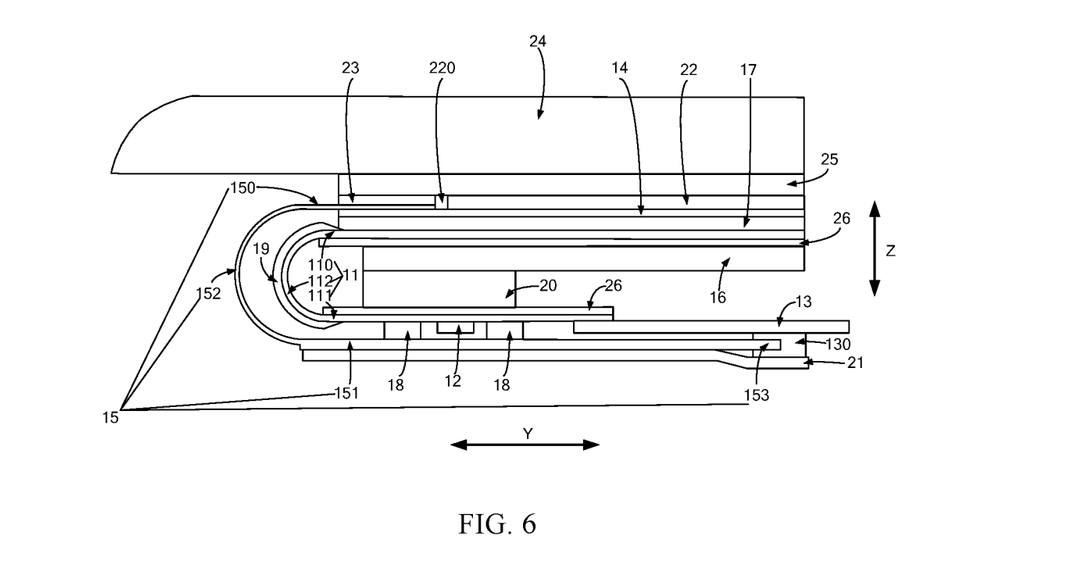
FIG. 6 is a schematic cross-sectional view taken along line D-D shown in FIG. 5.
Figure 7:
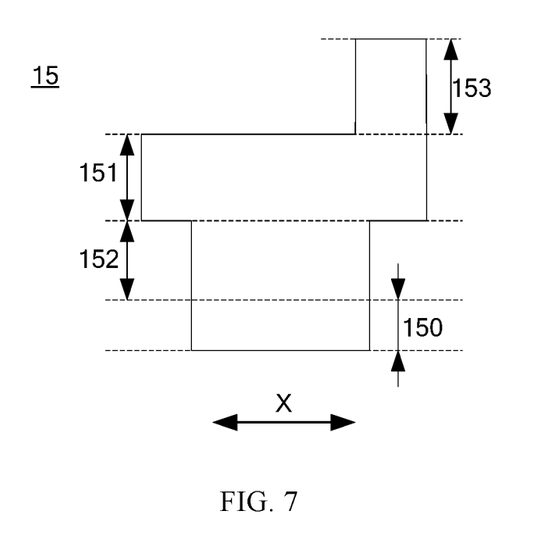
FIG. 7 is a schematic structural diagram of a flexible touch circuit board in a display device according to an embodiment of the present disclosure.

In view of the above, embodiments of the present disclosure provide another display device that can be applied to an electronic apparatus such as mobile phones. As shown in FIGS. 5 to 7, the display device 10 may include a flexible display panel 11, a driving chip 12, a main flexible circuit board 13, a touch layer 14, and a touch flexible circuit board 15.

As shown in FIGS. 5 and 6, the flexible display panel 11 may be an organic light-emitting diode (OLED) display, but is not limited to this. The flexible display panel 11 of the embodiment of the present disclosure may be in a bending state as a whole. In particular, the flexible display panel 11 may include a display part 110, a bonding part 111, and a substrate bending part 112 connecting the display part 110 and the bonding part 111. The display part 110 has a display side and a back side opposite in a thickness direction Z thereof. The bonding part 111 is arranged on the back side of the display part 110, and a side of the bonding part 111 away from the display part 110 is a bonding side. It should be noted that the thickness direction Z of the display part 110 can be understood as the thickness direction of the entire display device.

For example, the size of the substrate bending part 112 in a second direction X may be equal to the size of the bonding part 111 in the second direction X, and the second direction X is perpendicular to the thickness direction Z of the display part 110 and parallel to a bending axis of the substrate bending part 112. The size of the substrate bending part 112 in the second direction X may be smaller than the size of the display part 110 in the second direction X. In the second direction X, the substrate bending part 112 is centrally disposed relative to the display part 110, and two side surfaces of the substrate bending part 112 in the second direction X are flush with two side surfaces of the bonding part 111 in the second direction X, respectively. It should be understood that the size and positional relationship among the display part 112, the substrate bending part 112, and the bonding part 111 in the flexible display panel 11 are not limited to the form described above, and can be determined according to actual conditions.

As shown in FIGS. 5 and 6, the driving chip 12 may be arranged on the bonding side of the bonding part 111. That is to say, when the flexible display panel 11 of the embodiment of the present disclosure is in a bent state as a whole, the driving chip 12 is arranged on the side of the bonding part 111 away from the display part 110. The driving chip 12 has a first side and a second side opposite to each other in a first direction Y. The first direction Y is perpendicular to the thickness direction Z of the display part 110, and is perpendicular to the aforementioned second direction X. Specifically, the first side is close to the substrate bending part 112, and the second side is distal to the substrate bending part 112.

It should be noted that when the display device 10 has a long edge or a short edge, that is, when the display device 10 is rectangular as a whole, the first direction Y may be substantially parallel to the long edge of the display device 10, and the second direction X may be substantially parallel to the short edge of the display device 10. Alternatively, the first direction Y may be substantially parallel to the short edge of the display device 10, and the second direction X may be substantially parallel to the long edge of the display device 10. It should be understood that the substantially parallel mentioned here refers to completely parallel or a deviation existing that is less than a deviation threshold.

As shown in FIGS. 5 and 6, the main flexible circuit board 13 may be disposed on the second side of the driving chip 12, and connected to the bonding side of the bonding part 111. For example, the entire main flexible circuit board 13 may be a T-shaped structure as shown in FIG. 5, but it is not limited to this, and may also have other shapes.

As shown in FIG. 6, the touch layer 14 may be disposed on the display side of the display part 110. The touch layer 14 and the display part 110 in the embodiment of the present disclosure are independent of each other. Therefore, the touch layer 14 max be referred to as an external touch layer.

As shown in FIGS. 5 to 7, an end of the touch flexible circuit board 15 can be connected to the touch layer 14, and the other end can be connected to the main flexible circuit board 13. For example, when the flexible display panel 11 of the embodiment of the present disclosure is in a bent state as a whole, the touch flexible circuit board 15 is also in a bent state as a whole. Specifically, as shown in FIGS. 6 and 7, the touch flexible circuit board 15 may include a first portion 150, a second portion 151, and a bending portion 152 connecting the first portion 150 and the second portion 151. The first portion 150 is disposed a side of the touch layer 14 away from the display part 110 and connected to the touch layer 14. The bending portion 152 is located outside the substrate bending part 112. The second portion 151 is disposed on the side of the bonding part 111 away from the display part 110 (that is, the bonding side), and an end of the second portion 151 distal to the bending portion 152 is connected to the main flexible circuit board 13.

In the embodiment of the present disclosure, the orthographic projection of the touch flexible circuit board 15 on the bonding part 111 and the orthographic projection of the driving chip 12 on the bonding part 111 overlap. In other words, the touch flexible circuit board 15 is configured to be connected to the main flexible circuit board 13 through traces above the driving chip 12. Compared with the solution shown in FIG. 3 that the touch flexible circuit board 15 is connected to the main flexible circuit board 13 through traces on both sides of the driving chip 12, there will be a bigger space on both sides of the driving chip 12 that can be used as clearance zone B, as shown in FIG. 5. That is, the area of the clearance zone B can be increased to effectively solve the problem of lacking of sufficient clearance zone B existed in the electronic devices such as full-screen mobile phones, thereby improving antenna performance or increasing the number of antennas, and meeting the requirements for multi-band signal reception in 5G or future mobile phones and other electronic devices. It should be noted that the clearance zone B is not provided with a structure for shielding or interfering with signals, such as metal signal wires and the like.

In some embodiments, as shown in FIG. 5, the orthographic projection of the second portion 151 of the touch flexible circuit board 15 on the bonding part 111 can cover the orthographic projection of the driving chip 12 on the bonding part 111, that is, the orthographic projection of the driving chip 12 on the bonding part 111 is located within the orthographic projection of the second portion 151 of the touch flexible circuit board 15 on the bonding part 111, so that the touch flexible circuit board 15 has enough area to design the wiring.

Figure 8:
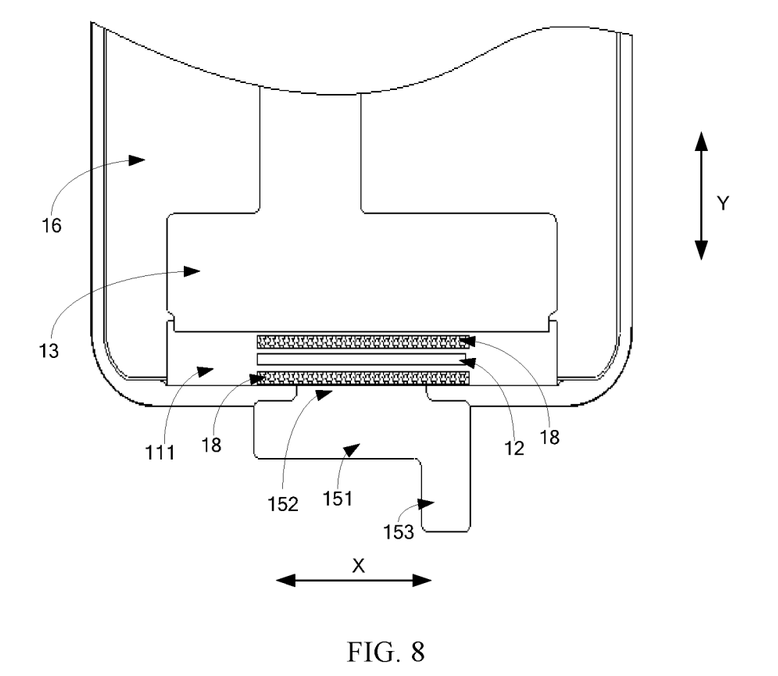
FIG. 8 is a schematic structural diagram of a flexible touch circuit board in a bending state in a display device according to an embodiment of the present disclosure.

As shown in FIG. 8, the size of the second portion 151 in the second direction X is substantially the same as the size of the driving chip 12 in the second direction X. In this way, the second portion 151 of the touch flexible circuit board 15 is prevented from occupying the clearance zone B while facilitating that the touch flexible circuit board 15 has enough area to design the wiring.

It should be noted that the two sizes being substantially the same means that the two sizes are completely same or, there is a deviation between the two sizes, and the deviation is less than the deviation threshold.

It should be understood that, as shown in FIG. 5, the area between the second portion 151 of the touch flexible circuit board 15 and the display part 110 in the second direction X may be the clearance zone B. The width H2 of the clearance zone B is 15 mm to 30 mm, such as 15 mm, 20 mm, 25 mm, 30 mm, etc. The width refers to the size in the second direction X. That is, the spacing between the second portion 151 and the display part 110 in the second direction X is 15 mm to 30 mm, which can improve antenna performance and/or increase the number of antennas. It should be noted that, in the second direction X, the spacing between the second portion 151 and the display part 110 is not limited to the foregoing range, and may also be determined according to actual conditions, such as the size of the whole machine or the size of other structural parts.

In some embodiments, as shown in FIG. 7, the size of the first portion 150 of the touch flexible circuit board 15 in the second direction X may be smaller than the size of the touch layer 14 in the second direction X. The orthographic projection of the first portion 150 on the touch layer 14 may be located in the touch layer 14, and specifically may be located in the central area of the touch layer 14 in the second direction X. That is, the spacing between one end of the first portion 150 in the second direction X and a corresponding side of the touch layer 14 may be substantially equal to the spacing between the other side of the first portion 150 in the second direction X and the other corresponding side of the touch layer 14. The size of the bending portion 152 in the second direction X may be substantially equal to the size of the first portion 150 in the second direction X, and the two sides of the bending portion 152 in the second direction X may be flush with two side surfaces of the first portion 150 in the second direction X. The size of the second portion 151 in the second direction X may be greater than the size of the bending portion 152 in the second direction X, and two side surfaces in the second direction X are located outside two side surfaces of the bending portion 152 in the second direction X respectively. Specifically, the bending portion 152 may be centrally disposed relative to the second portion 151, that is, the spacing between one side of the bending portion 152 in the second direction X and a corresponding side of the second portion 151 may be substantially equal to the spacing between the other side of the bending portion 152 in the second direction X and the other corresponding side of the second portion 151.

In the embodiment of the present disclosure, the touch flexible circuit board 15 is ensured to have a sufficient area for wiring while ensuring the bending performance thereof.

Further, as shown in FIGS. 5 and 6, an end of the second portion 151 of the touch flexible circuit board 15 distal to the bending portion 152 may be provided with a plug-in part 153, and the side of the main flexible circuit board 13 away from the display part 110 is provided with a connector 130 that is plugged into the plug-in part 153. The connector 130 may be a ZIF (Zero-Insertion Force) connector, but is not limited to this.

It should be noted that the touch flexible circuit board 15 may have a multi-layer structure. Specifically, the multi-layer structure may include multiple insulation protection layers and circuit layers located between adjacent insulation protection layers. The number of the insulation protection layers and the circuit layers can be determined according to the actual situation. It should also be noted that the number of insulation protection layers and circuit layers in different areas of the touch flexible circuit board 15 may be the same or different, and the different areas may include the first portion. 150, the second portion 151, the bending portion 152, and the like.

Since the touch flexible circuit board 15 in the embodiment of the present disclosure is connected to the main flexible circuit board 13 through traces above the driving chip 12, the display device 10 of the embodiment may further include a spacer/spacers 18 to prevent the touch flexible circuit board 15 from contacting the driving chip 12. The spacer/spacers may be disposed on the bonding side of the bonding part 111, and the spacers 18 may be located on one side or two sides of the driving chip 12 in the first direction Y, as shown in FIGS. 6 and 8. Specifically, two spacers 18 can be provided, one is located on a first side of the driving chip 12, the other is located on a second side of the driving chip 12. The thickness of the spacer 18 is greater than the thickness of the driving chip 12 to avoid contact between the touch flexible circuit board 15 and the driving chip 12 when the touch flexible circuit board 15 is connected to the main flexible circuit board 13, thereby preventing the driving chip 12 from being easily damaged due to external forces.

Optionally, the difference between the thickness of the spacer 18 and the thickness of the driving chip 12 can be greater than or equal to 50 μm, so that the touch flexible circuit board 15 is prevented from contacting the driving chip 12 when being connected to the main flexible circuit 13, without affecting the thickness of the whole machine. It should be noted that, as shown in FIG. 6, the thickness mentioned in the present disclosure is a dimension in the thickness direction Z of the display part 110, and the thickness direction Z is perpendicular to the first direction Y and the second direction X.

In addition, the gap between the spacer 18 and the driving chip 12 can be greater than or equal to 0.3 mm to meet the tolerance size requirement, but is not limited to this, and can also be other values depending on the specific situation.

In some embodiments, as shown in FIG. 6 and FIG. 8, the orthographic projection of the driving chip 12 on a reference plane is located within the orthographic projection of the spacer 18 on the reference plane, so that the driving chip 12 is better protected to avoid damage. It should be noted that the reference plane is a plane parallel to the thickness direction Z and perpendicular to the first direction Y.

Optionally, as shown in FIG. 8, the size of the spacer 18 in the second direction X is substantially the same as the size of the driving chip 12 in the second direction X. In this way, the driving chip 12 is better protected, and the space occupied by the spacer 18 is reduced, thereby facilitating the design of other structures.

In some embodiments, the spacer 18 can be bonded to the bonding part 111, and bonded to the touch flexible circuit board 15. That is, the spacer 18 can be a double-sides adhesive tape. Through such structure, on the one hand, the difficulty of connecting the spacer 18 and the bonding part 111 is reduced, and the stability of the connection between the spacer 18 and the bonding part 111 is ensured; on the other hand, the spacer 18 can further be configured to fix the touch flexible circuit board 15 while the touch flexible circuit board 15 is connected to the main flexible circuit board 13.

Figure 9:
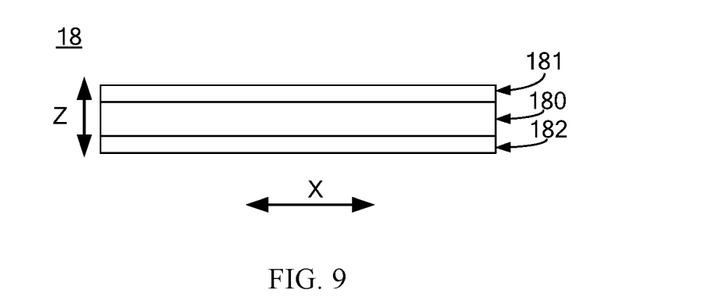
FIG. 9 is a schematic structural diagram of a spacer part in a display device according to an embodiment of the present disclosure.

For example, as shown in FIG. 9, the spacer 18 may include a polyethylene terephthalate (PET) substrate 180, and a first adhesive layer 181 and a second adhesive layer 182 located on both sides of the PET substrate 180. The first adhesive layer 181 can be bonded to the bonding part 111, and the second adhesive layer 182 can be bonded to the second portion 151 of the touch flexible circuit board 15. It should be noted that the material of the substrate in the spacer 18 is not limited to PET, and may be other materials.

In some embodiments, as shown in FIG. 6, the back side of the display part 110 in the flexible display panel 11 and the side of the bonding part 111 facing the display part 110 can be provided with a back film 26. Optionally, the display device 10 may further include a protective film layer 19. The protective film layer 19 is configured to cover a surface of the substrate bending part 112 that is close to the bending portion 152, and cover part of surface of the display part 110 and the bonding part 111 that is close to the substrate bending part 112, so as to protect the substrate bending part 112 of the flexible display panel 11 to prevent it from breaking during a bending process.

In some embodiments, as shown in FIG. 6, the display device 10 can further include a cushion film layer 20. The cushion film layer 20 is located between the bonding part 111 and the display part 110, and is configured to ensure the bending arc and bending stability of the flexible display panel 11. For example, the cushion film layer 20 is made of PET material, and both sides of the cushion film layer 20 are connected to the display part 110 and the bonding part 111 by bonding to ensure the flexible display panel 11's bending state.

When the heightening film layer 20 is made of PET material, due to the poor thermal conductivity of PET material, the heat generated by structures bonded to the bonding part 111, such as the driving chip 12, during operation is difficult to radiate in time, so that heat accumulates at the bonding part 111. After the heat is conducted to the display part 110, the luminescent material at the display part 110 is likely to be attenuated, thereby leading poor display. To improve this situation, as shown in FIG. 6, the display device 10 may further include a heat dissipation film layer 16. The heat dissipation film layer 16 is located on the back side of the display part 110 and located on a side of the cushion film layer 20 away from the bonding part 111. That is to say, the heightening film layer 20 is located on the side of the heat dissipation film layer 16 away from the display part 110. The heat dissipation film layer 16 can be configured to quickly dissipate the heat generated by the structures bonded at the bonding part 111, so as to prevent from heat being accumulated at the bonding part 111 and transferring to the display part 110. It should be noted that the area of the orthographic projection of the heat dissipation film layer 16 on the display part 110 is larger than that of the cushion film layer 20 on the display part 110, so that the heat is further quickly dissipated.

When the back film 26 is provided on the back side of the display part 110, the heat dissipation film layer 16 may be located on the side of the back film 26 away from the display part 110.

For example, the heat dissipation film layer 16 may have a multilayer structure, and may include an embossed silicone buffer material (EMBO) layer, a Foam (foam material) layer, and a polyimide film (PI) layer, a copper (Cu) foil layer and an absorbing material layer arranged in sequence, but not limited to this. The heat dissipation film layer 16 can also be composed of other film layers, as long as the heat dissipation film layer 16 has good heat dissipation performance and bendable performance. In addition, the heat dissipation film layer 16 may also be a single-layer structure depending on the specific circumstances.

In some embodiments, as shown in FIG. 6, the display device 10 can further include an insulation protective film 21. The insulation protective film 21 may be located on a side of the second portion 151 of the touch flexible circuit board 15 away from the display part 110 to protect the touch flexible circuit board 15. In addition, the insulation protective film 21 can also cover the connector 130 on the main flexible circuit board 13, that is, the connection between the touch flexible circuit board 15 and the main flexible circuit board 13 can be protected to ensure connection stability of the touch flexible circuit board 15 and the main flexible circuit board 13.

Figure 10:
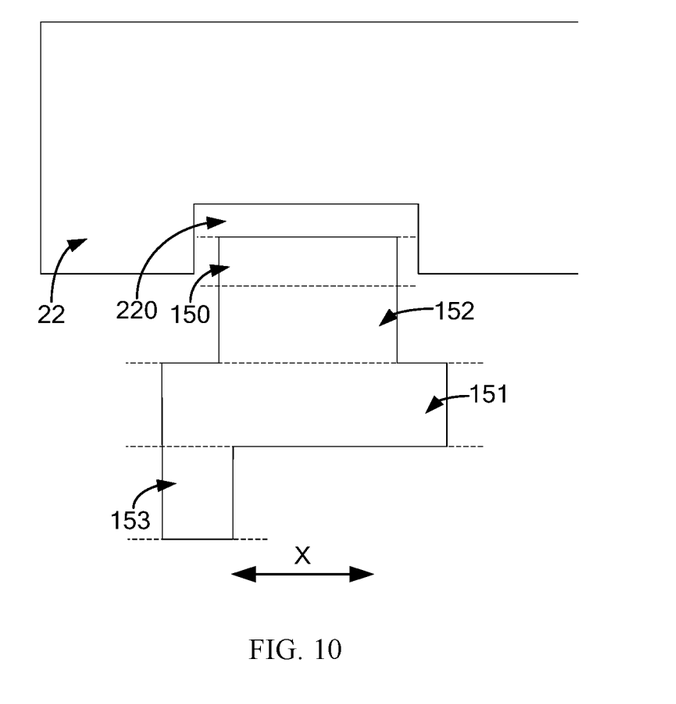
FIG. 10 is a schematic diagram illustrating a location arrangement of a polarizer and a flexible touch circuit board in a display device according to an embodiment of the present disclosure.

In some embodiments, as shown in FIGS. 6 and 10, the display device 10 may further include a polarizer 22. The polarizer 22 is located on the side of the touch layer 14 away from the display part 110. The orthographic projection of the polarizer 22 on the touch layer 14 has a notch 220, and the orthographic projection of the first portion 150 of the touch flexible circuit board 15 on the touch layer 14 may be located in the notch 220.

Since the orthographic projection of the first portion 150 of the touch flexible circuit board 15 on the touch layer 14 does not overlap with the orthographic projection of the polarizer 22 on the touch layer 14, there is no height difference between a part of the touch layer 14 that contacts the touch flexible circuit board 15 and other parts of touch layer 14, thereby reducing the risk of breakage of the touch panel.

In addition, since the orthographic projection of the first portion 150 of the touch flexible circuit board 15 on the touch layer 14 is located in the notch 220, that is, the first portion 150 of the touch flexible circuit board 15 is half-enclosed by the polarizer 22, it can be ensured that the polarizer 22 has a sufficiently large area. It should be noted that the notch 220 may be rectangular, but is not limited thereto, and may also be semicircular or other irregular shapes, which is not limited in the embodiment of the present disclosure.

In addition, it should be understood that, as shown in FIGS. 6 and 10, a certain gap is required between the outer edge of the first portion 150 of the touch flexible circuit board 15 and the inner edge of the notch 220 of the polarizer 22. The gap can be 0.3 mm, but it is not limited to this, as long as the tolerance size requirement is met, which can further avoid the situation that the polarizer 22 and the first portion 150 are superimposed.

As shown in FIG. 6, the thickness of the first portion 150 of the touch flexible circuit board 15 is generally smaller than the thickness of the polarizer 22. Therefore, in order to enhance the stability of the touch flexible circuit board 15 and further reduce a probability of breaking when bending the touch flexible circuit board 15, the display device 10 of the embodiment of the present disclosure may further include a flattened portion 23. The flattened portion 23 may be located on the side of the first portion 150 away from the touch layer 14, and the surface of the flattened portion 23 away from the touch layer 14 and the surface of the polarizer 22 away from the touch layer 14 are substantially flush.

It should be noted that two surfaces are substantially flush means: the two surfaces are completely flush; or, the two surfaces are not completely flush, but the distance between the two surfaces is small (for example, less than the distance threshold).

For example, the flattened portion 23 may be connected to the first portion 150 of the touch flexible circuit board 15 through bonding. The orthographic projection of the flattened portion 23 on the touch layer 14 is substantially coincide with the orthographic projection of the first portion 150 of the touch flexible circuit board 15 on the touch layer 14. It should be noted that two orthographic projections substantially overlap means that the two orthographic projections completely overlap; or, there is a deviation between the centers of the two orthographic projections, and the deviation is less than the deviation threshold.

In some embodiments, as shown in FIG. 6, the display device 10 may further include a cover plate 24, a first optically clear adhesive 17 and a second optically clear adhesive 25. The first optically clear adhesive 17 is located between the touch layer 14 and the display part 110 of the flexible display panel 11; the second optically clear adhesive 25 is located between the polarizer 22 and the cover plate 24, and the second optically clear adhesive 25 can also cover the flattened portion 23.

An embodiment of the present disclosure further provides an electronic apparatus, which may include the display device 10 in any of the embodiments as shown in FIGS. 5 to 10, but is not limited to this, and may also include multiple antenna structures (Not shown). At least part of the antenna structures of the multiple antenna structures may correspond to the clearance zone B shown in FIG. 5. For example, the antenna structure can be an omnidirectional antenna, that is, the signal radiation intensity in each direction of 360° of the antenna cross section is the same to achieve the best communication effect.

According to the embodiments of the present disclosure, the type of the electronic apparatus is not particularly limited, and can be the types of electronic devices commonly used in the field, for example mobile devices such as mobile phones, laptops, and tablets, wearable devices such as watches and bracelets, and any products or components with display functions such as digital photo frames, navigators, etc. Those skilled in the art can select according to the specific use of the electronic apparatus, and will not be repeated here.

It should be noted that, besides the display device 10 and the antenna structure, the electronic apparatus further includes other necessary parts and components. Taking a mobile phone as an example, the electronic apparatus further includes a casing, a battery, and the like. Those skilled in the art can refer to the specific use requirements to incorporate components accordingly, which is note repeated here.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display device, comprising:
    a flexible display panel comprising a display part, a bonding part, and a substrate bending part connecting the display part and the bonding part, wherein the display part comprises a display side and a back side opposite in a thickness direction of the display part, the bonding part is disposed on the back side of the display part, and a bonding side of the bonding part is away from the display part;
    a driving chip disposed on the bonding side of the bonding part, wherein the driving chip comprises a first side and a second side opposite to each other in a first direction, the first side is close to the substrate bending part, the second side is distal to the substrate bending part, and the first direction is perpendicular to the thickness direction;
    a main flexible circuit board disposed on the second side of the driving chip and connected to the bonding side of the bonding part;
    a touch layer disposed on the display side of the display part; and
    a touch flexible circuit board, wherein an end of the touch flexible circuit board is connected to the touch layer, the other end of the touch flexible circuit board is connected to the main flexible circuit board, and an orthographic projection of the touch flexible circuit board on the bonding part and orthographic projection of the driving chip on the bonding part overlap; wherein:
    the touch flexible circuit board comprises a first portion, a second portion, and a bending portion connecting the first portion and the second portion;
    the first portion is located on a side of the touch layer away from the display part and connected to the touch layer, the second portion is located on the side of the bonding part away from the display part, and an end of the second portion distal to the bending portion is connected to the main flexible circuit board; and
    the orthographic projection of the driving chip on the bonding part is located in the orthographic projection of the second portion on the bonding part.

2. The display device according to claim 1, further comprising a spacer disposed on the bonding side of the bonding part, wherein the spacer is located on one side or both sides of the driving chip in the first direction, and a thickness of the spacer is greater than a thickness of the driving chip.

3. The display device according to claim 2, wherein a difference between the thickness of the spacer and the thickness of the driving chip is greater than or equal to 50 µm.

4. The display device according to claim 2, wherein a gap between the spacer and the driving chip is greater than or equal to 0.3 mm.

5. The display device according to claim 2, wherein orthographic projection of the driving chip on a reference plane is located within orthographic projection of the spacer on the reference plane, wherein the reference plane is a plane parallel to the thickness direction.

6. The display device according to claim 5, wherein a size of the spacer in a second direction is equal to a size of the driving chip in the second direction, and the second direction is perpendicular to the first direction and the thickness direction.

7. The display device according to claim 2, wherein the spacer is bonded to the bonding part, and the spacer is bonded to the touch flexible circuit board.

8. The display device according to claim 1, wherein a size of the second portion in a second direction is equal to a size of the driving chip in the second direction, and the second direction is perpendicular to the first direction.

9. The display device according to claim 8, wherein:
a size of the first portion in the second direction is less than a size of the touch layer in the second direction, and the orthographic projection of the first portion on the touch layer is located within the touch layer;
a size of the bending portion in the second direction is equal to the size of the first portion in the second direction, and two side surfaces of the bending portion in the second direction are in flush with two side surfaces of the first portion in the second direction, respectively;
the size of the second portion in the second direction is greater than a size of the bending portion in the second direction, and two side surfaces of the second portion in the second direction are located outside of two side surfaces of the bending portion in the second direction respectively; and
an end of the second portion distal to the bending portion is provided with a plug-in part, and the side of the main flexible circuit board away from the display part is provided with a connector that is plugged into the plug-in part.

10. The display device according to claim 8, wherein a spacing between the second portion and the display part in the second direction is from 15 mm to 30 mm.

11. The display device according to claim 1, further comprising a polarizer disposed on the side of the touch layer away from the display part, wherein the orthographic projection of the polarizer on the touch layer has a notch, and the orthographic projection of the first portion on the touch layer is located in the notch.

12. The display device according to claim 11, wherein:
the thickness of the first portion is less than the thickness of the polarizer;
the display device further comprises a flattened portion disposed on a side of the first portion away from the touch layer; and
a surface of the flattened portion away from the touch layer is flush with the surface of the polarizer away from the touch layer.

13. The display device according to claim 1, wherein:
the thickness of the substrate bending part is less than the thickness of the display part and the thickness of the bonding part; and
the display device further comprises a protective film layer, wherein the protective film layer is configured to cover a surface of the substrate bending part that is close to the bending portion, and cover part of surface of the display part and the bonding part that is close to the substrate bending part.

14. The display device according to claim 1, further comprising a heightening film layer disposed between the bonding part and the display part.

15. The display device according to claim 14, further comprising a heat dissipation film layer located on the back side of the display part and disposed on the side of the heightening film layer away from the bonding part.

16. An electronic apparatus comprising a display device, wherein the display device comprises:
a flexible display panel comprising a display part, a bonding part, and a substrate bending part connecting the display part and the bonding part, wherein the display part comprises a display side and a back side opposite in a thickness direction of the display part, the bonding part is disposed on the back side of the display part, and a bonding side of the bonding part is away from the display part;
a driving chip disposed on the bonding side of the bonding part, wherein the driving chip comprises a first side and a second side opposite to each other in a first direction, the first side is close to the substrate bending part, and the second side is distal to the substrate bending part, wherein the first direction is perpendicular to the thickness direction;
a main flexible circuit board disposed on the second side of the driving chip and connected to the bonding side of the bonding part;
a touch layer disposed on the display side of the display part; and
a touch flexible circuit board, wherein an end of the touch flexible circuit board is connected to the touch layer, the other end of the touch flexible circuit board is connected to the main flexible circuit board, and an orthographic projection of the touch flexible circuit board on the bonding part and orthographic projection of the driving chip on the bonding part overlap; wherein:
the touch flexible circuit board comprises a first portion, a second portion, and a bending portion connecting the first portion and the second portion;
the first portion is located on a side of the touch layer away from the display part and connected to the touch layer, the second portion is located on the side of the bonding part away from the display part, and an end of the second portion distal to the bending portion is connected to the main flexible circuit board; and
the orthographic projection of the driving chip on the bonding part is located in the orthographic projection of the second portion on the bonding part.

17. The electronic apparatus according to claim 16, wherein the display device further comprises a spacer disposed on the bonding side of the bonding part, wherein the spacer is located on one side or both sides of the driving chip in the first direction, and a thickness of the spacer is greater than a thickness of the driving chip.

18. The electronic apparatus according to claim 17, wherein a difference between the thickness of the spacer and the thickness of the driving chip is greater than or equal to 50 µm.

19. The electronic apparatus according to claim 17, wherein a gap between the spacer and the driving chip is greater than or equal to 0.3 mm.

20. A display device, comprising:
- a flexible display panel comprising a display part, a bonding part, and a substrate bending part connecting the display part and the bonding part, wherein the display part comprises a display side and a back side opposite in a thickness direction of the display part, the bonding part is disposed on the back side of the display part, and a bonding side of the bonding part is away from the display part;
- a driving chip disposed on the bonding side of the bonding part, wherein the driving chip comprises a first side and a second side opposite to each other in a first direction, the first side is close to the substrate bending part, the second side is distal to the substrate bending part, and the first direction is perpendicular to the thickness direction;
- a main flexible circuit board disposed on the second side of the driving chip and connected to the bonding side of the bonding part;
- a touch layer disposed on the display side of the display part; and
- a touch flexible circuit board, wherein an end of the touch flexible circuit board is connected to the touch layer, the other end of the touch flexible circuit board is connected to the main flexible circuit board, and an orthographic projection of the touch flexible circuit board on the bonding part and orthographic projection of the driving chip on the bonding part overlap
- a spacer disposed on the bonding side of the bonding part, wherein the spacer is located on one side or both sides of the driving chip in the first direction, and a thickness of the spacer is greater than a thickness of the driving chip.

* * * * *